(12) United States Patent
Nishi et al.

(10) Patent No.: US 8,143,525 B2
(45) Date of Patent: Mar. 27, 2012

(54) SOLAR CELL LEAD WIRE AND PRODUCTION METHOD THEREFOR AND SOLAR CELL USING SAME

(75) Inventors: Hajime Nishi, Hitachi (JP); Yuju Endo, Hitachi (JP); Hiroyuki Akutsu, Hitachi (JP); Hiroshi Bando, Hitachi (JP); Iku Higashidani, Hitachi (JP); Katsunori Sawahata, Hitachi (JP); Yukio Ito, Hitachi (JP); Hiroshi Okikawa, Hitachi (JP)

(73) Assignees: Hitachi Cable, Ltd., Tokyo (JP); Hitachi Cable Fine-Tech, Ltd., Hitachi-shi, Ibaraki (JP)

( * ) Notice: Subject to any disclaimer, the term of this patent is extended or adjusted under 35 U.S.C. 154(b) by 465 days.

(21) Appl. No.: 12/314,772

(22) Filed: Dec. 16, 2008

(65) Prior Publication Data

US 2009/0255710 A1    Oct. 15, 2009

(30) Foreign Application Priority Data

Apr. 15, 2008 (JP) ................................ 2008-106177
Jun. 2, 2008 (JP) ................................ 2008-144820
Jul. 23, 2008 (JP) ................................ 2008-189768

(51) Int. Cl.
*H01B 5/00* (2006.01)
(52) U.S. Cl. .................................. 174/126.2
(58) Field of Classification Search .......... 174/126.1, 174/126.2, 94 R
See application file for complete search history.

(56) References Cited

U.S. PATENT DOCUMENTS

| | | | |
|---|---|---|---|
| 7,754,973 B2 * | 7/2010 | Shiomi et al. | 174/126.2 |
| 2003/0024733 A1 * | 2/2003 | Aoyama et al. | 174/260 |
| 2005/0039943 A1 * | 2/2005 | Endo et al. | 174/94 R |
| 2006/0272844 A1 | 12/2006 | Berghofer et al. | |
| 2007/0017570 A1 * | 1/2007 | Endo et al. | 136/256 |
| 2007/0062574 A1 * | 3/2007 | Shiomi et al. | 136/256 |
| 2008/0169020 A1 * | 7/2008 | Shiomi et al. | 136/252 |
| 2009/0044966 A1 | 2/2009 | Tazawa | |
| 2009/0283573 A1 | 11/2009 | Shiomi et al. | |

FOREIGN PATENT DOCUMENTS

| | | | |
|---|---|---|---|
| EP | 1 626 443 A1 | | 2/2006 |
| EP | 1758175 A1 * | | 2/2007 |
| JP | 7-54118 A | | 2/1995 |
| JP | 2005-050780 (A) | | 2/2005 |
| JP | 2006-54355 A | | 2/2006 |
| WO | WO 2004/105141 A1 | | 2/2004 |
| WO | WO 2004/105141 A1 * | | 12/2004 |
| WO | WO2005/114751 A1 * | | 12/2005 |
| WO | WO 2007/088851 A1 | | 8/2007 |

* cited by examiner

*Primary Examiner* — William Mayo, III
(74) *Attorney, Agent, or Firm* — McGinn IP Law Group, PLLC

(57) ABSTRACT

A solar cell lead wire includes a strip-shaped conductive material formed by rolling a wire, and upper and lower melt solder-plated layers formed to be flat on upper and lower surfaces, respectively, of the strip-shaped conductive material by supplying melt solder thereto.

12 Claims, 6 Drawing Sheets

- 33 MELT SOLDER-PLATED LAYER
- 32a
- 30 SOLAR CELL LEAD WIRE
- 32 STRIP-SHAPED CONDUCTIVE MATERIAL
- 34 MELT SOLDER-PLATED LAYER
- 32b

- 19 PULLING-UP ROLLER
- 12a
- 18a, 18b
- 17a, 17b
- 15 SOLDER BATH
- 12 STRIP-SHAPED CONDUCTIVE MATERIAL
- 16 INVERSION ROLLER
- 12b

| 17a, 17b LOWER ROLL |
| 18a, 18b UPPER ROLL |

RELATED ART    FIG.6A
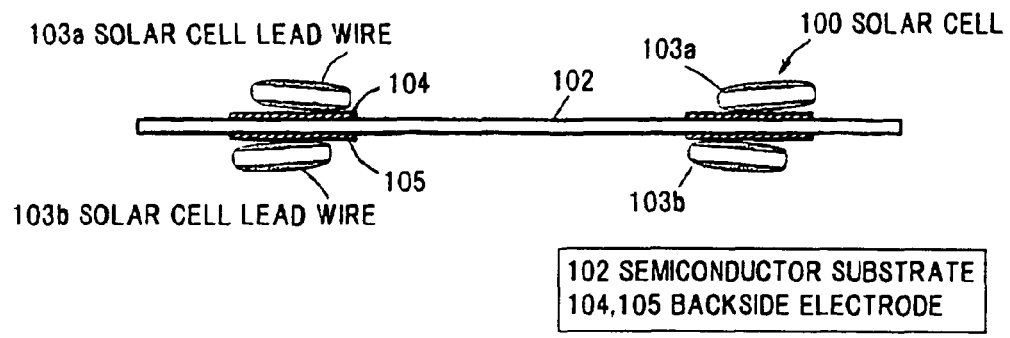
RELATED ART    FIG.6B
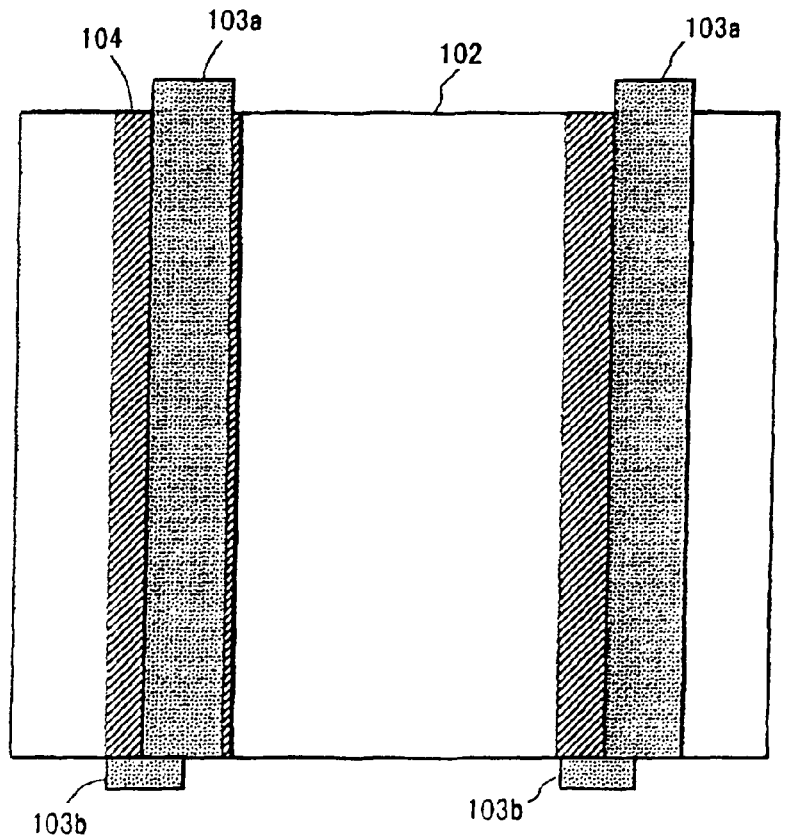

RELATED ART  FIG.7
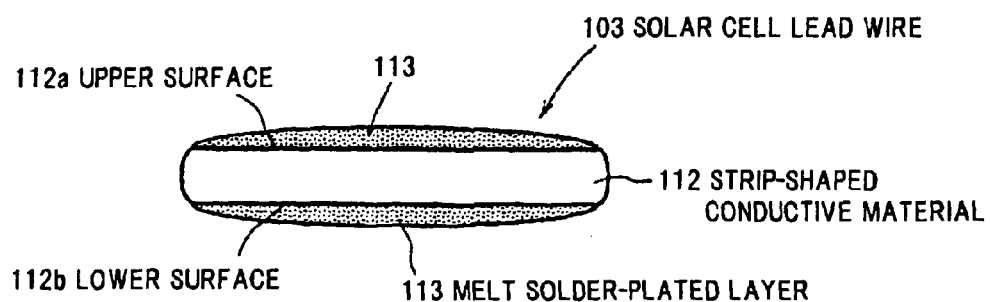
RELATED ART  FIG.8
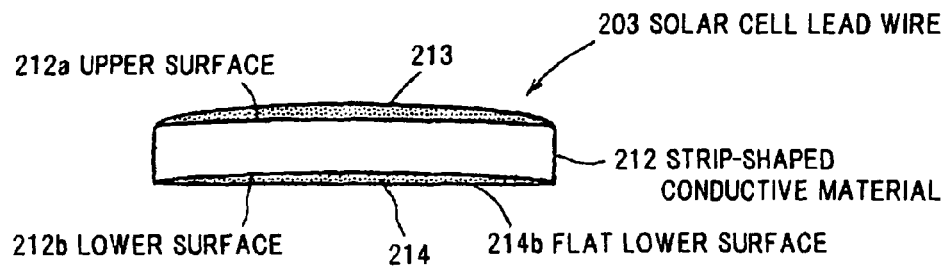

SOLAR CELL LEAD WIRE AND PRODUCTION METHOD THEREFOR AND SOLAR CELL USING SAME

The present application is based on Japanese patent application Nos. 2008-106177, 2008-144820 and 2008-189768 filed Apr. 15, 2008, Jun. 2, 2008 and Jul. 23, 2008, respectively, the entire contents of which are incorporated herein by reference.

BACKGROUND OF THE INVENTION

1. Field of the Invention

The present invention relates to a solar cell lead wire, and particularly to a solar cell lead wire with a high cell cracking inhibiting effect and a production method therefor and a solar cell using the lead wire.

2. Description of the Related Art

In solar cells, as semiconductor substrates, there are used polycrystalline and monocrystalline Si cells.

As shown in FIGS. 6A and 6B, a solar cell 100 is fabricated by solder-bonding solar cell lead wires 103a and 103b to specified regions of semiconductor substrate 102, i.e., to frontside and backside electrodes 104 and 105 provided on the frontside and backside, respectively, of the semiconductor substrate 102. Power generated in the semiconductor substrate 102 is transmitted outside through the solar cell lead wire 103.

As shown in FIG. 7, the conventional solar cell lead wire 103 comprises a strip-shaped conductive material 112 and melt solder-plated layers 113 formed over the upper and lower surfaces, respectively, of the strip-shaped conductive material 112. The strip-shaped conductive material 112 is formed by rolling a conductor with a circular cross section into a strip shape, and is also referred to as a rectangular conductor or a rectangular wire.

The melt solder-plated layers 113 are formed by supplying melt solder (melt plating) to the upper and lower surfaces of the strip-shaped conductive material 112.

The melt plating method cleans the upper and lower surfaces 112a and 112b of strip-shaped conductive material 112 with acid or the like, passes the strip-shaped conductive material 112 through a melt solder bath, and thereby stacks solder on the upper and lower surfaces 112a and 112b of the strip-shaped conductive material 112. As shown in FIG. 7, the melt solder-plated layers 113 are formed to be rounded from sides in width direction to the middle, by surface tension when melt solder adhering to the upper and lower surfaces 112a and 112b of the strip-shaped conductive material 112 is solidified.

The conventional solar cell lead wire 103 shown in FIG. 7 has the rounded melt solder-plated layers 113 formed on the upper and lower surfaces 112a and 112b of the strip-shaped conductive material 112. Since this solar cell lead wire 103 has the rounded melt solder-plated layers 113, when wound around a bobbin, the stacked layer is unlikely to be stable, and tends to unwind. The lead wire may be tangled and not drawn due to unwinding.

This solar cell lead wire 103 is cut at specified length, air-sucked, transferred and soldered to the frontside electrode 104 of the semiconductor substrate 102. The frontside electrode 104 is formed beforehand with an electrode strip (not shown) conducting with the frontside electrode 104. This frontside electrode 104 is contacted with melt solder-plated layers 113 of solar cell lead wire 103a, followed by soldering in that state. The same applies to soldering of solar cell lead wire 103b to backside electrode 105 of the semiconductor substrate 102.

In this case, since melt solder-plated layers 113 in solar cell lead wire 103 of FIG. 7 is rounded and uneven in thickness, there is the problem of insufficient suction due to small contact area with an air suction jig, and therefore falling during transfer. Also, the contact area between frontside electrode 104 and melt solder-plated layers 113 is small. The small contact area between the frontside electrode 104 and melt solder-plated layer 113 causes insufficient thermal conduction from semiconductor substrate 102 to melt solder-plated layer 113, and therefore poor soldering.

Also, when bonding the solar cell lead wires 103a and 103b to both the frontside and backside of the semiconductor substrate 102, the small contact area between the frontside electrode 104 and melt solder-plated layer 113 causes a position shift between the solar cell lead wire 103a soldered to the frontside electrode 104 and the solar cell lead wire 103b soldered to the backside electrode 105. That position shift causes cell cracking (semiconductor substrate 102 cracking). Because the semiconductor substrate 102 is expensive, cell cracking is undesirable.

To solve the problem of the small contact area between the frontside electrode 104 and the melt solder-plated layer 113, there has been suggested a method of forming a depressed lower surface in strip-shaped conductive material, supplying melt solder to the depressed lower surface and thereby forming a flat melt solder-plated layer (See International Publication WO2004/105141).

As shown in FIG. 8, a solar cell lead wire 203 disclosed by International Publication WO2004/105141 uses a strip-shaped conductive material 212 formed with depressed lower surface 212b. Upper surface 212a of the strip-shaped conductive material 212 is rounded or flat. The strip-shaped conductive material 212 which is depressed at only its lower surface 212b in this manner is passed through a melt solder bath, to thereby form melt solder-plated layers 213 and 214 over the upper and lower surfaces 212a and 212b, respectively, of the strip-shaped conductive material 212. The melt solder-plated layer 214 at the depressed lower surface 212b of the strip-shaped conductive material 212 is flat.

Soldering a flat lower surface 214b of the melt solder-plated layer 214 of such solar cell lead wire 203 to a frontside or backside electrode of a semiconductor substrate allows the solar cell lead wire 203 to be firmly bonded to the semiconductor substrate, and be unlikely to be separate therefrom, resulting in excellent durability.

As described above, to firmly bond the solar cell lead wire to the semiconductor substrate, it is preferable to form flat the melt solder-plated layers 113 and 214. However, according to International Publication WO2004/105141, to form the depressed lower surface 212b in the strip-shaped conductive material 212, the strip-shaped conductive material 212 is deformed or bent appropriately. For example, the strip-shaped conductive material 212 is passed around a mold roll to thereby form a depressed surface. Also, when a flat sheet cladding material is slit to provide a strip-shaped conductive material, a rotary blade pitch or rotary speed is adjusted for bending. In this manner, the strip-shaped conductive material 212 with the depressed lower surface is provided.

However, the deforming or bending is intermittent, and therefore poor in mass productivity. Also, passing the strip-shaped conductive material 212 around a mold roll leads to poor accuracy in cross section dimensions of the strip-shaped conductive material 212 with the depressed lower surface because of difficult pressure adjustment to the strip-shaped conductive material 212.

When the strip-shaped conductive material 212 is slit to form a depressed surface therein, burr occurs at both sides of the lower surface 212b of the strip-shaped conductive material 212. The burr present on the strip-shaped conductive material 212 and the thin melt solder-plated layer 214 thereon, when the solar cell lead wire 203 is bonded to the semiconductor substrate 102, causes the burr and cell to come into contact due to melting of the solder-plated layer 214, leading to stress concentration in the contact portion of the burr and cell, and therefore cell cracking in the semiconductor substrate 102.

Also, in the solar cell lead wire 203 of International Publication WO2004/105141, connection is made from the backside electrode of the first semiconductor substrate to the frontside electrode of the second semiconductor substrate, and from the backside electrode of the second semiconductor substrate to the frontside electrode of the third semiconductor substrate. When in this manner the solar cell lead wire 203 is bonded to both the frontside and backside of the semiconductor substrate, the problem is unsolved of causing a position shift between the solar cell lead wire 203 soldered to the frontside electrode and the solar cell lead wire 203 soldered to the backside electrode. There remains the problem of this position shift causing cell cracking in the semiconductor substrate.

Further, even if the plated layer is flat and no burr is present, if the conductor has a corner as in a rectangular parallelepiped shape, the conductor leans during solder melting, to cause a contact between the corner of the conductor and the cell to cause stress concentration at the contact portion therebetween to cause cell cracking in the semiconductor substrate.

The semiconductor substrate is made thin because of occupying most of the cost of the solar cell. However, the thin semiconductor substrate tends to crack. For example, for the semiconductor substrate being at thicknesses of not more than 200 μm, the cell cracking rate is large. The thin semiconductor substrate, in which cell cracking is caused by the solar cell lead wire, is not desired.

SUMMARY OF THE INVENTION

Accordingly, it is an object of the present invention to provide a solar cell lead wire, which obviates the above problem and has a high cell cracking inhibiting effect, and a production method therefor and a solar cell using the lead wire.

(1) According to one embodiment of the invention, a solar cell lead wire comprises:
a strip-shaped conductive material formed by rolling a wire; and
upper and lower melt solder-plated layers formed to be flat on upper and lower surfaces, respectively, of the strip-shaped conductive material by supplying melt solder thereto.

(2) According to another embodiment of the invention, a solar cell lead wire comprises:
a strip-shaped conductive material formed by slitting; and
upper and lower melt solder-plated layers formed to be flat on upper and lower surfaces, respectively, of the strip-shaped conductive material by supplying melt solder thereto,
wherein the lower surface of the strip-shaped conductive material is formed to be depressed, and the lower melt solder-plated layer is not less than 5 μm thick at both ends.

In the above embodiment (1) or (2), the following modifications and changes can be made.

(i) The strip-shaped conductive material comprises a rectangular wire whose volume resistivity is not more than 50 μΩ·mm.

(ii) The strip-shaped conductive material comprises one of Cu, Al, Ag and Au.

(iii) The strip-shaped conductive material comprises one of tough pitch Cu, low oxygen Cu, oxygen-free Cu, phosphorous deoxidized Cu, and high purity Cu whose purity is not less than 99.9999%.

(iv) The melt solder-plated layers comprise a Sn-based solder or a Sn-based solder alloy containing Sn as a first component, and not less than 0.1 mass % of at least one element selected from Pb, In, Bi, Sb, Ag, Zn, Ni, and Cu, as a second component.

(3) According to another embodiment of the invention, a production method for a solar cell lead wire comprises:
rolling a wire to thereby form a strip-shaped conductive material;
heating the strip-shaped conductive material in a continuous current heating furnace or continuous heating furnace or batch-type heating equipment;
subsequently supplying melt solder to solder-plate the strip-shaped conductive material; and
sandwiching the plated strip-shaped conductive material between rolls to thereby form flat melt solder-plated layers.

(4) According to another embodiment of the invention, a production method for a solar cell lead wire comprises:
slitting a sheet material to thereby form a strip-shaped conductive material, the lower surface of the strip-shaped conductive material formed to be depressed;
heating the strip-shaped conductive material in a continuous current heating furnace or continuous heating furnace or batch-type heating equipment;
subsequently supplying melt solder to solder-plate the strip-shaped conductive material; and
sandwiching the plated strip-shaped conductive material between rolls to thereby form flat melt solder-plated layers,
wherein the melt solder-plated layer on the lower surface is not less than 5 μm thick at both ends.

(5) According to another embodiment of the invention, a solar cell comprises:
the solar cell lead wire according to the embodiment (1) or (2); and
a semiconductor substrate comprising frontside and backside electrodes, wherein the solar cell lead wire is soldered to the frontside and backside electrodes of the semiconductor substrate with the solder of the melt solder-plated layers.

ADVANTAGES

The invention exhibits the excellent effect of being able to provide a solar cell lead wire with a high cell cracking inhibiting effect.

BRIEF DESCRIPTION OF THE DRAWINGS

The preferred embodiments according to the invention will be explained below referring to the drawings, wherein:

FIGS. 6A and 6B are cross-sectional and top views, respectively, illustrating the conventional solar cell;

FIG. 7 is a cross-sectional view illustrating the conventional solar cell lead wire; and FIG. 8 is a side cross-sectional view illustrating the conventional solar cell lead wire.

DETAILED DESCRIPTION OF THE PREFERRED EMBODIMENTS

Figure 1A:
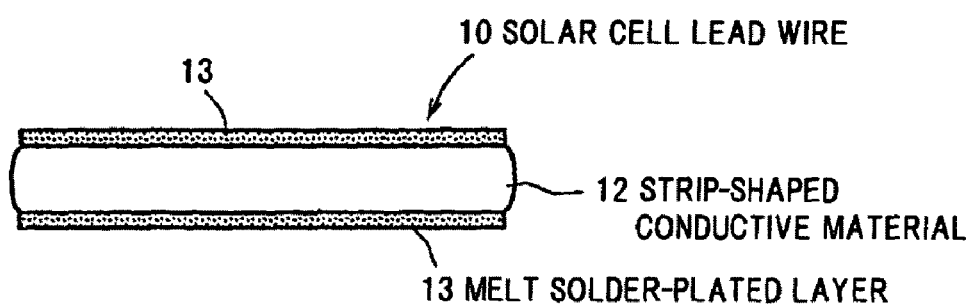
FIG. 1A is a cross-sectional view illustrating a solar cell lead wire in a first embodiment according to the present invention.

As shown in FIG. 1A, a solar cell lead wire 10 according to the present invention has upper and lower melt solder-plated layers 13, 13 formed to be flat by supplying melt solder on upper and lower sides of a strip-shaped conductive material 12, sandwiching between rolls the strip-shaped conductive material 12 plated at a solder bath exit, and adjusting plating thickness thereof. Here, the "flat" refers to irregularities in plated surface being not more than 3 μm.

The strip-shaped conductive material 12 is formed by rolling a wire (wire rod with circular cross section), and heating it in a continuous current heating furnace or continuous heating furnace or batch-type heating equipment.

Figure 1B:
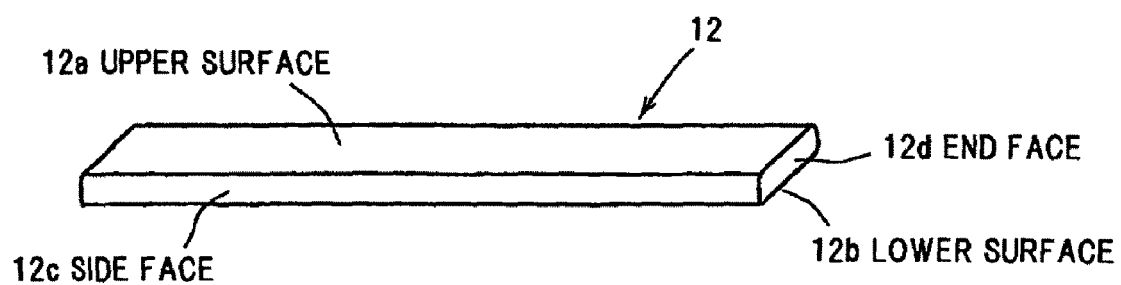
FIG. 1B is a schematic perspective view illustrating a strip-shaped conductive material for the solar cell lead wire in the first embodiment.

FIG. 1B is a perspective view illustrating the strip-shaped conductive material 12, where its upper and lower surfaces 12a and 12b are formed to be flat, side face 12c is formed to be rounded, and end face 12d is formed by cutting at a suitable length.

Figure 4:
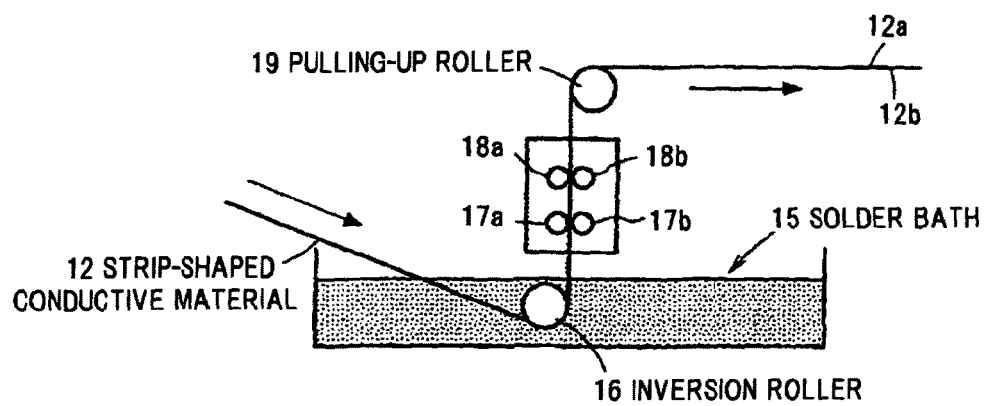
FIG. 4 is a schematic view illustrating a melt-plating equipment for forming a melt solder-plated layer.

FIG. 4 illustrates a melt-plating equipment for flattening the melt solder-plated layers 13, 13. The melt-plating equipment comprises an inversion roller 16 provided in a solder bath 15 for inverting strip-shaped conductive material 12 upwardly, upper and lower pairs of rolls 17a, 17b, 18a, 18b provided above the solder bath 15 and positioned above the roller 16, and a pulling-up roller 19 provided thereabove.

The strip-shaped conductive material 12 is immersed in the solder bath 15 to thereby be supplied with solder on its upper and lower surfaces, and is inverted upwardly at the inversion roller 16. Its plated layers are sandwiched between the lower rolls 17a and 17b and further between the upper rolls 18a and 18b. By adjusting its final plating thickness at the upper rolls 18a and 18b, solar cell lead wire 10 with the flat melt solder-plated layers 13, 13 as shown in FIG. 1A, is produced.

The upper and lower rolls 17a, 17b, 18a, 18b to form flat the melt solder-plated layers 13, 13 on the strip-shaped conductive material 12 are arranged to sandwich the upper and lower surfaces of the strip-shaped conductive material 12 at the solder bath exit, fine-adjust the spacing between the upper and lower rolls 17a, 17b, 18a, 18b and thereby adjust the plating thickness and cross-section shape of the flat melt solder-plated layers 13, 13.

Figure 2A:
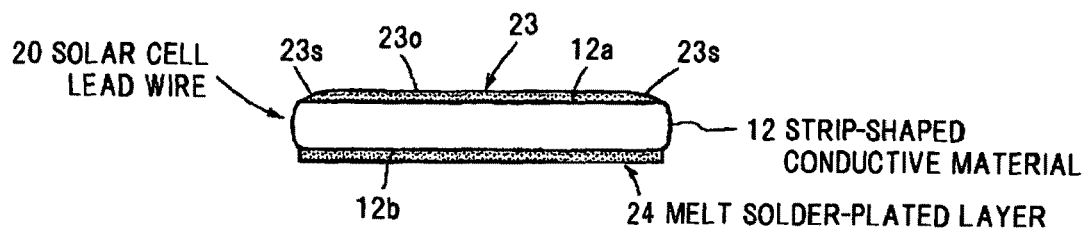
FIGS. 2A to 2C are cross-sectional views illustrating a solar cell lead wire in a second embodiment according to the present invention.
Figure 2B:
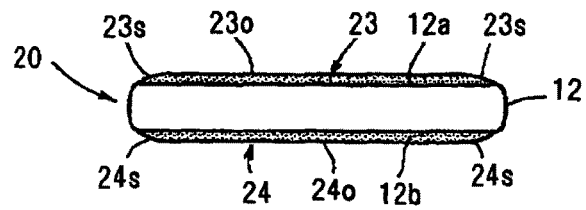

FIGS. 2A and 2B illustrate other shapes of solar cell lead wires according to the present invention.

A solar cell lead wire 20 of FIG. 2A is formed so that melt solder-plated layer 23 on upper surface 12a of the strip-shaped conductive material 12 is flat in middle portion 23o, and is rounded at both sides 23s, while entire melt solder-plated layer 24 on lower surface 12b is flat.

Also, a solar cell lead wire 20 of FIG. 2B is formed so that the melt solder-plated layers 23 and 24 on the upper and lower surfaces 12a and 12b of the strip-shaped conductive material 12 are flat in middle portions 23o and 24o, and are rounded at both sides 23s and 24s, respectively.

Figure 2C:
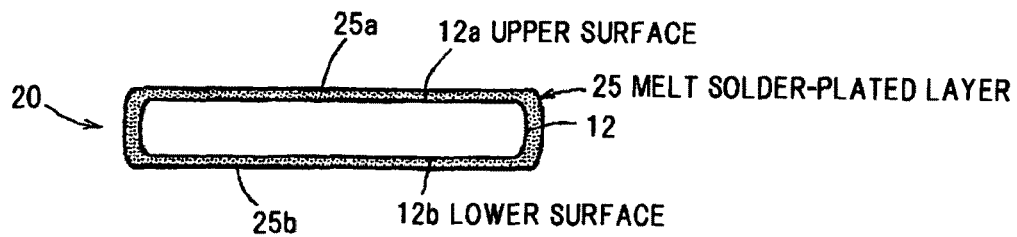

A solar cell lead wire 20 of FIG. 2C is formed so that a melt solder-plated layer 25 is formed to cover the periphery of the strip-shaped conductive material 12 and melt solder-plated layers 25a, 25b covering the upper and lower surfaces 12a and 12b are flat.

These shapes as shown in FIGS. 2A and 2B are formed by adjusting the amount of melt solder plating, the spacing between and position of the upper and lower rolls 17a, 17b, 18a, 18b. The shape as shown in FIG. 2C is formed by adjusting the pulling speed of the strip-shaped conductive material 12 during the formation of melt solder-plated layer in addition to the adjustment of the spacing and position of the rolls.

That is, in forming the melt solder-plated layers 23 and 24 on the upper and lower surfaces of the strip-shaped conductive material 12 in the melt-plating equipment of FIG. 4, the inversion roller 16 and pulling-up roller 19 determine a path through which the strip-shaped conductive material 12 runs upwardly and downwardly, and fine-adjusting the position of and spacing between the upper and lower rolls 17a, 17b, 18a, 18b relative to the path allows adjustment of the respective thicknesses and total thickness of the upper and lower melt solder-plated layers 23 and 24, and the spacing between the lower rolls 17a and 17b determines the initial total layer thickness and the spacing between the upper rolls 18a and 18b determines the final total layer thickness.

Further, when the strip-shaped conductive material 12 is inverted at the pulling-up roller 19, its upper surface has the upper melt solder-plated layer 23 while its lower surface has the lower melt solder-plated layer 24. The flatness of the melt solder-plated layers 23 and 24 is then determined so that the flatness of the upper melt solder-plated layer 23 is determined by the left lower and upper rolls 17a and 18a in the figure while the flatness of the lower melt solder-plated layer 24 is determined by the right lower and upper rolls 17b and 18b in the figure. Accordingly, adjusting the position of these rolls 17a, 17b, 18a, 18b relative to the path allows adjustment of the flatness of the melt solder-plated layers.

Further, by lowering the pulling speed of the strip-shaped conductive material 12 during the formation of melt solder-plated layer, the solder attached to the strip-shaped conductive material 12 is cooled and therefore the amount of solder flowing down into the solder bath increases. As a result, the amount of solder attached to the strip-shaped conductive material 12 can be reduced. On the contrary, by increasing the pulling speed of the strip-shaped conductive material 12, the solder attached to the strip-shaped conductive material 12 is rapidly cooled and therefore the amount of solder flowing down into the solder bath decreases. As a result, the amount of solder attached to the strip-shaped conductive material 12 can be increased.

That is, the upper melt solder-plated layer 23 of the solar cell lead wire 20 as shown in FIG. 2A can be formed to be rounded at both its sides 23s by arranging the upper roll 18a slightly apart from the path. Also, the upper and lower melt solder-plated layers 23 and 24 of the solar cell lead wire 20 as shown in FIG. 2B can be formed to be rounded at both its sides 23s and 24s by arranging the upper rolls 18a and 18b, respectively, slightly apart from the path. Also, in this case, varying the pulling speed according to adjustment of position of and spacing between the rolls 17a, 17b, 18a, 18b allows control of the thickness and solidified state of the melt solder-plated layers, and therefore formation of the desired flatness of the melt solder-plated layers.

The melt solder-plated layer covering the entire periphery of the solar cell lead wire 20 as shown in FIG. 2C can be formed by controlling the pulling speed of the strip-shaped conductive material 12 during the formation of the melt solder-plated layer higher than that in FIG. 2A.

When the conductor width and electrode width of the strip-shaped conductive material 12 shown in FIG. 2 are equal, controlling (i.e., such that the shapes in FIGS. 2A and 2B are obtained) the amount of solder supplied prevents the solder, which contributes to bonding of the strip-shaped conductive material and semiconductor substrate, from being excessively supplied to frontside and backside electrode-bonded portions, flowing to portions other than the electrodes and making the light-receiving surface of the cell small. This results in solar cell lead wire 20 being excellent in shadow loss control.

Figure 3:
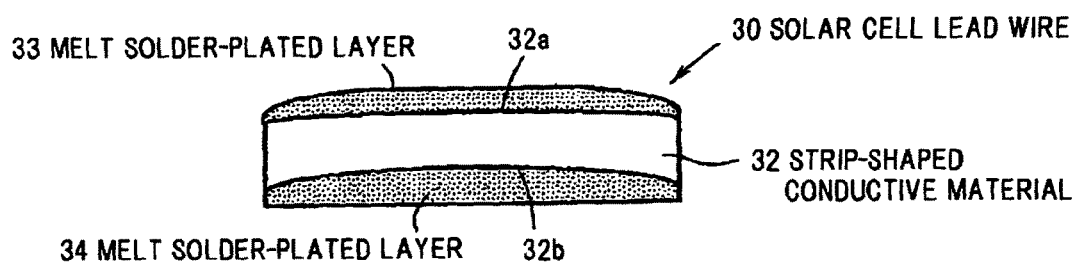
FIG. 3 is a cross-sectional view illustrating a solar cell lead wire in a third embodiment according to the present invention.

Next, a solar cell lead wire 30 of FIG. 3 is formed by slitting strip-shaped conductive material 32 to have a depressed lower surface 32b and forming melt solder-plated layers 33 and 34 on upper and lower surfaces 32a and 32b respectively of the strip-shaped conductive material 32 using melt plating equipment shown in FIG. 4.

In this case, the lower melt solder-plated layer 34 is formed to be not less than 5 μm thick at both ends thereof taking burr into consideration.

The strip-shaped conductive material 32 with depressed lower surface 32b can be formed to have the depressed lower surface 32b and slightly protruding upper surface 32a by adjusting a rotary blade pitch or rotary speed of the slitter when slitting a flat sheet into the strip, as disclosed in International Publication WO2004/105141.

The strip-shaped conductive material 32 slit can apply to various-width material. Namely, even if the width of the strip-shaped conductive material 32 is not uniform longitudinally, or even in the case of using different-width various conductive materials 32, slitting permits formation of the long and longitudinally uniform width strip.

In this embodiment, in the case a wide conductor is required as in backside wiring, it is necessary to use strip-shaped conductive material 32 molded by slitting, in which case the plating thickness at its ends is not less than 5 μm and the melt solder-plated layer 34 is formed to be flat so as not to cause cell cracking in burr at the ends during bonding, thereby resulting in solar cell lead wire 30 being excellent in shadow loss control (and also applicable to backside wiring).

In this manner, the solar cell lead wire 10, 20, 30 according to the present invention is formed to have flat melt solder-plated layer 13, 23, 24, 33, 34 to facilitate installation to the frontside and backside electrodes of the semiconductor substrate, and ensure sufficient thermal conduction required during bonding. This permits orderly installation and firm soldering to the frontside and backside electrodes. Also, the plated layer has a high close contact property with an air suction jig because of its flatness, and is unlikely to fall during transfer. Further, because of the flat plated layer, when wound around a bobbin, the stacked layer tends to be stable and is unlikely to unwind. Thus, there arises no problem of the lead wire being tangled and not drawn due to unwinding.

For the strip-shaped conductive material 12, there is used a rectangular wire with a volume resistivity of not more than 50 μΩ·mm, for example. This rectangular wire is rolled to thereby provide strip-shaped conductive material 12 with a cross section shape as in FIG. 1B, or is slit to thereby provide strip-shaped conductive material 32 as shown in FIG. 3.

The strip-shaped conductive material 12 or 32 is formed of one of Cu, Al, Ag, and Au, or one of tough pitch Cu, low oxygen Cu, oxygen-free Cu, phosphorous deoxidized Cu, and high purity Cu with a purity of not less than 99.9999%.

As the melt solder-plated layer, there is used a Sn-based solder (a Sn-based solder alloy). The Sn-based solder contains Sn as a first heaviest component, and not less than 0.1 mass % of at least one element selected from Pb, In, Bi, Sb, Ag, Zn, Ni, and Cu, as a second component.

Next are explained advantages of the invention.

In soldering solar cell lead wire 10 shown in FIG. 1A to frontside and backside electrodes 54 and 55 of semiconductor substrate 52 shown in FIG. 5, the temperature of heating the solar cell lead wire 10 or semiconductor substrate 52 is controlled at temperature around a solder melting point of melt solder-plated layer 13. The reason for that is because of a significant difference between thermal expansivity of strip-shaped conductive material 12 (e.g. copper) of solar cell lead wire 10 and thermal expansivity of the semiconductor substrate (Si). The thermal expansivity difference causes thermal stress which causes cracking in semiconductor substrate 52. To reduce this thermal stress, low-temperature bonding is preferable. Thus, the temperature of heating the solar cell lead wire 10 or semiconductor substrate 52 is controlled at temperature around a solder melting point of melt solder-plated layer 13.

During bonding, the heating method places semiconductor substrate 52 on a hot plate, and uses both heating from this hot plate and heating from above solar cell lead wire 10 placed on semiconductor substrate 52.

To make large the contact area between frontside and backside electrodes 54 and 55 of semiconductor substrate 52 and melt solder-plated layer 13 for sufficient thermal conduction from semiconductor substrate 52 to melt solder-plated layer 13, it is preferable to make the shape of solar cell lead wire 10 including melt solder-plated layer 13 rectangular.

However, conventional solar cell lead wire 103 shown in FIG. 7 is rounded in its longitudinal middle portion, and as shown in FIG. 6, when soldered to frontside and backside electrodes 104 and 105 of semiconductor substrate 102, the contact area between frontside and backside electrodes 104 and 105 of semiconductor substrate 52 and melt solder-plated layer 113 of solar cell lead wire 103 is small. This leads to insufficient thermal conduction, or unstable position of placing solar cell lead wire 103 on frontside and backside electrodes 104 and 105 and therefore shift of position of solar cell lead wire 103 on the frontside and backside of semiconductor substrate 102. These cause cell cracking.

Since the present invention has the flat melt solder-plated layer 13 on the upper and lower surfaces of solar cell lead wire 10, the above conventional problem is overcome.

The solar cell lead wire 203 disclosed by International Publication WO2004/105141 shown in FIG. 8 accommodates melt solder in depressed lower surface 212b of strip-shaped conductive material 212, and thereby makes melt solder-plated layer 214 flat. However, when a flat sheet is slit to form strip-shaped conductive material 212 with depressed lower surface 212b, burr occurs at both sides of lower surface 212b of strip-shaped conductive material 212. The burr causes stress concentration in the bonded portion of solar cell lead wire 203 with semiconductor substrate 102 and therefore causes cell cracking.

Also, the strip-shaped conductive material 212 with depressed lower surface used in solar cell lead wire 203 of International Publication WO2004/105141 is depressed at lower surface 212b only, and relatively flat at upper surface 212a. Forming melt solder-plated layers 213 and 214 on such strip-shaped conductive material 212 makes melt solder-plated layer 214 in lower surface 212b flat, but melt solder-plated layer 213 on upper surface 212a rounded. Namely, solar cell lead wire 203 of International Publication WO2004/105141 has the flat lower surface of melt solder-plated layer 214, and the rounded upper surface of melt solder-plated layer 213. Bonding such solar cell lead wire 203 to both the frontside and backside of semiconductor substrate 102 causes a shift of position of solar cell lead wire 203 on the frontside and backside. This position shift causes cell cracking in semiconductor substrate 102.

Next is explained the reason for this cell cracking.

The strip-shaped conductive material 212 and semiconductor substrate 102 are bonded by bringing solar cell lead wire 203 and semiconductor substrate 102 together to bonded portions (frontside and backside electrodes 104 and 105), sandwiching the bonded portions therebetween, and heating. In this case, if burr is present in the strip-shaped conductive material 212, the burr applies high pressure to the semiconductor substrate 102, thereby causing cell cracking therein. Also, bonding to semiconductor substrate 102 strip-shaped conductive material 212 with rounded bonded surface tends to cause a shift of contact positions of electrodes 104 and 105 of semiconductor substrate 102 and solar cell lead wire 203 on the frontside and backside of the semiconductor substrate 102, as shown in FIG. 6A. The shift causes alternate sandwiching by strip-shaped conductive materials 212 on the frontside and backside, respectively, of the semiconductor substrate 102, thereby causing cell cracking.

However, when strip-shaped conductive material 32 with upper and lower melt solder-plated layers 33 and 34 shown in FIG. 3 of the present invention having a flat bonded surface is bonded to semiconductor substrate 50, solar cell lead wire 30 is unlikely to shift on frontside and backside electrodes 54 and 55. In the case of no shift, sandwiching by solar cell lead wires 30 with flat bonded surface is done at substantially the same position on the frontside and backside of the semiconductor substrate 52, thereby making stress to the semiconductor substrate 52 small, resulting in no cell cracking.

In this manner, the solar cell lead wire 10, 20, 30 according to the present invention is formed by rolls 17, 18 to have flat melt solder plating on the upper and lower surfaces of strip-shaped conductive material 12, 32 molded by rolling or slitting. This results in no burr, and a flat surface bonded with the semiconductor substrate. Thus, cell cracking is inhibited.

Also, the present invention squeezes melt solder with rolls 17 and 18 to thereby inhibit the plated layer thickness from being uneven during high-speed melt plating, and therefore allows higher-speed specified plating thickness formation and excellent mass productivity. As a result, the present invention can provide a solar cell lead wire having the cell cracking inhibiting effect the most.

Further, since the present invention supplies melt solder to the upper and lower surfaces of strip-shaped conductive material 12, 32, adjusts rolls 17 and 18, and thereby forms flat melt solder-plated layer 13, 23, 24, 33, 34, the solar cell lead wire 10, 20, 30 is flat at both its upper and lower surfaces. Thus, when the solar cell lead wire 10, 20, is bonded to the upper and lower surfaces of strip-shaped conductive material 52, there is no position shift between the solar cell lead wire 10, 20, 30 soldered to frontside electrode 54 and the solar cell lead wire 10, 20, 30 soldered to backside electrode 55.

Also, even when forming thick flat solder plating on the upper and lower surfaces of strip-shaped conductive material 12, 32, the present invention causes no position shift as in conventional solder plating wires, and can supply sufficient solder during bonding, and therefore have a stable rounded solder fillet formed on a Si cell frontside electrode after lead wire bonding. The fillet refers to wax or solder forced out from a waxed or soldered joint gap.

Next, the properties of strip-shaped conductive materials to be used in the present invention are shown in Table 1.

TABLE 1

| | Material | | | |
|---|---|---|---|---|
| | Cu | Ag | Au | Al |
| Thermal expansion coefficient ($\times 10^{-6}/^\circ$ C.) | 17.0 | 19.1 | 29.1 | 23.5 |
| 0.2% proof strength (MPa) | 40 | 55 | 30 | 20 |
| Volume resistivity ($\mu\Omega \cdot$ mm) | 16.9 | 16.3 | 22.0 | 26.7 |

It is preferable that the strip-shaped conductive material is a relatively small volume resistivity material. As in Table 1, as the strip-shaped conductive material, there are Cu, Al, Ag, Au, and the like.

Of Cu, Al, Ag, and Au, the lowest volume resistivity material is Ag. Accordingly, using Ag as the strip-shaped conductive material permits maximization of power generation efficiency of a solar cell using solar cell lead wire 1. Using Cu as the strip-shaped conductive material permits a low cost solar cell lead wire. Using Al as the strip-shaped conductive material permits ensuring a lightweight solar cell lead wire 10, 20, or 30.

In the case of using Cu as the strip-shaped conductive material, any of tough pitch Cu, low oxygen Cu, oxygen-free Cu, phosphorous deoxidized Cu, or high purity Cu with a purity of not less than 99.9999% may be used as the Cu. To minimize the 0.2% proof strength of the strip-shaped conductive material, it is advantageous to use a high purity Cu. Thus, using a high purity Cu with a purity of not less than 99.9999% permits a small 0.2% proof strength of the strip-shaped conductive material. Using a tough pitch Cu or phosphorous deoxidized Cu permits a low cost solar cell lead wire.

As solder to be used for the melt solder-plated layer, there is a Sn-based solder or a Sn-based solder alloy containing Sn as a first component, and not less than 0.1 mass % of at least one element selected from Pb, In, Bi, Sb, Ag, Zn, Ni, and Cu, as a second component. These solders may contain a not more than 1000 ppm trace element as a third component.

Next is explained a method for producing a solar cell lead wire of the present invention.

First, a wire material with circular cross section (not shown) is rolled, or a flat sheet is slit to thereby form a strip-shaped conductive material. This strip-shaped conductive material is heated in a continuous current heating furnace or continuous heating furnace or batch-type heating equipment, followed by melt solder supply using a plating line as in FIG. 4, to form a flat melt solder-plated layer.

Generally, solids or liquids tend to be as small as possible because of intermolecular force acting between internal molecules inside the solids or liquids. Surface molecules are surrounded by different molecules on one side, and are therefore in a high internal energy state, and tend to stabilize the excess energy state. In the case of solder (liquid) in contact with air, the intermolecular force in the air is extremely small compared to the intermolecular force in the solder, and therefore solder surface molecules are not attracted by air molecules, but by only molecules inside the solder. Thus, the solder surface molecules always tend to move into the solder, and as a result, the solder surface tends to have a spherical shape with the smallest surface area (the smallest number of elements constituting the solder).

The conventional solar cell lead wire 103 shown in FIG. 7 has formed on the upper and lower surfaces of strip-shaped conductive material 112, melt solder-plated layer 113 solidified in a rounded shape by such force (surface tension) acting to make the surface area small. The reason for the solder to be spherical not being spherical is because of interface interaction force (interface tension) acting between the solder and strip-shaped conductive material 112.

In contrast, the solar cell lead wire 10, 20, 30 of the present invention allows melt solder-plated layer 13, 23, 24, 33, 34 to be formed to be flat by passing between rolls immediately before solder solidification.

As a method for processing raw material into strip-shaped conductive material, both rolling and slitting are applicable. The rolling is a method of rolling a round wire into a rectangular shape. Forming strip-shaped conductive material by rolling permits long and longitudinally uniform width strip-shaped conductive material formation. The slitting can apply to various width materials. Namely, even if conductive raw material width is not uniform longitudinally, or even in the case of using various conductive raw materials with different widths, slitting thereof permits long and longitudinally uniform width strip-shaped conductive material formation.

Heat treatment of the strip-shaped conductive material permits enhancement in the softening property of the strip-shaped conductive material. Enhancing the softening property of the strip-shaped conductive material is effective in reducing the 0.2% proof strength. As a heat treatment method, there are continuous current heating, continuous heating, and batch-type heating. For longitudinal continuous heat treatment, the continuous current heating or continuous heating is preferred. Where stable heat treatment is required, the batch-type heating is preferred. From the point of view of preventing oxidization, it is preferable to use an inert gas (e.g., nitrogen) or hydrogen reduction atmosphere furnace.

The inert gas or hydrogen reduction atmosphere furnace is provided in a continuous current heating furnace or continuous heating furnace or batch-type heating equipment.

Next a solar cell of the present invention will be explained in detail.

Figure 5A:
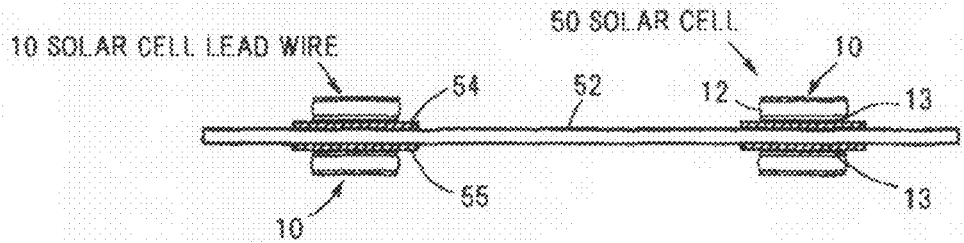
FIGS. 5A and 5B are cross-sectional and top views, respectively, illustrating a solar cell according to the present invention.
Figure 5B:
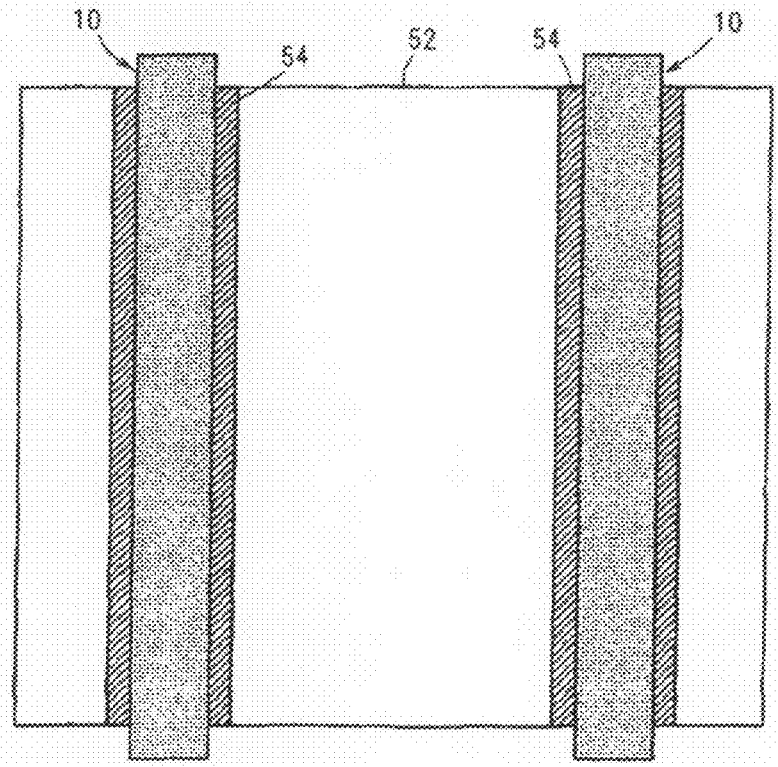

As shown in FIGS. 5A and 5B, a solar cell 50 of the present invention is that constructed by soldering solar cell lead wire 10 (or 20 or 30) so far explained, with melt solder-plated layer 13, to frontside and backside electrodes 54 and 55 of semiconductor substrate 52.

Since the melt solder-plated layer 13, which is the bonded surface between solar cell lead wire 10 and frontside and backside electrodes 54 and 55, is flat, the position of the solar cell lead wire 10 on the frontside and backside of the semiconductor substrate 52 is stabilized, thereby preventing position shift.

The solar cell 50 of the present invention has a high bonding strength between solar cell lead wire 10 and the semiconductor substrate, and can inhibit cell cracking during bonding, thereby ensuring enhancement in solar cell yielding.

EXAMPLE 1

A Cu conductive raw material is rolled to form a 2.0 mm wide, 0.16 mm thick rectangular wire strip-shaped conductive material. This strip-shaped conductive material is heated in batch-type heating equipment, and further is coated with Sn-3% Ag-0.5% Cu solder plating therearound in melt plating equipment shown in FIG. 4 to form a flat melt solder-plated layer (middle plating thickness 20 μm) on the upper and lower sides of the strip-shaped conductive material (the conductor is heated Cu). This results in a solar cell lead wire 10 of FIG. 1A.

EXAMPLES 2, 3 AND 4

Similarly to the solar cell lead wire 10 of Example 1, a strip-shaped conductive material is formed, heated in batch-type heating equipment, and further is coated with Sn-3% Ag-0.5% Cu solder plating therearound while varying pulling speed thereof in melt plating equipment shown in FIG. 4 to form a flat melt solder-plated layer (middle plating thickness 20 μm) on the upper and lower sides of the strip-shaped conductive material (the conductor is heated Cu).

In Example 2, the pulling speed of the conductor is lower than that in Example 1, and the positioning is controlled such that the distance of the conductor and the roll at the lower surface is shorter than that at the upper surface. In Example 3, the pulling speed of the conductor is lower than that in Example 1 as in Example 2, and the positioning is controlled such that the distance of the conductor and the roll is equal at the upper and lower surfaces. In Example 4, the pulling speed of the conductor is higher than that in Example 1, and the positioning is controlled such that the distance of the conductor and the roll at the lower surface is equal at the upper and lower surfaces.

Where the pulling speed of the conductor lowers, the solder attached to the conductor is cooled and therefore the amount of solder flowing down into the solder bath increases. As a result, the amount of solder attached to the conductor can be reduced. In this case, the material cost of solder can be reduced.

On the contrary, where the pulling speed increases, the solder attached to the conductor is rapidly cooled and therefore the amount of solder flowing down into the solder bath decreases. As a result, the amount of solder attached to the conductor can be increased. In this case, the cost for the plating process can be reduced due to the increased plating speed, and the bonding performance to the cell can be enhanced due to the sufficient amount of solder supplied.

As described above, the solar cell lead wires 20 shown in FIGS. 2A, 2B and 2C of Examples 2, 3 and 4, respectively can be obtained.

EXAMPLE 5

A Cu-invar-Cu (ratio 2:1:2) conductive raw material is slit to form a 2.0 mm wide, 0.16 mm thick rectangular wire strip-shaped conductive material. This strip-shaped conductive material is coated with solder plating therearound in melt plating equipment shown in FIG. 4 to form a flat melt solder-plated layer (middle plating thickness 20 μm) on the upper and lower sides of the strip-shaped conductive material (the conductor is heated Cu). Its plating condition is adjusted so that the end plating thickness is 5 μm. This results in a solar cell lead wire 30 of FIG. 3.

COMPARISON EXAMPLE 1

A Cu conductive raw material is rolled to form a 2.0 mm wide, 0.16 mm thick rectangular wire strip-shaped conductive material 112. This strip-shaped conductive material 112 is heated in batch-type heating equipment, and further is coated with solder plating therearound to form a rounded melt solder-plated layer 113 (middle plating thickness 20 μm) on the flat upper and lower sides of the strip-shaped conductive material 112 (the conductor is heated Cu). This results in a solar cell lead wire 103 of FIG. 7.

COMPARISON EXAMPLE 2

A Cu-invar-Cu (ratio 2:1:2) conductive raw material is slit to form a 2.0 mm wide, 0.16 mm thick strip-shaped conductive material 212 with a depressed lower surface. This strip-shaped conductive material 212 is coated with solder plating therearound to form a flat melt solder-plated layer 214 (middle plating thickness 20 μm) on the depressed surface 212b of the strip-shaped conductive material 212, while forming a rounded melt solder-plated layer 213 (middle plating thickness 20 μm) on the flat side thereof. This results in a solar cell lead wire 203 of FIG. 8. The end plating thickness is 4 μm.

The results of observing the cross-section shape of the solar cell lead wires of Examples 1, 2, 3, 4 and 5 and Comparison Examples 1 and 2 have verified that Examples 1, 2, 3, 4 and 5 have flat upper and lower surfaces to be bonded to the semiconductor substrate.

The cross section of Comparison Example 1 has middle-rounded upper and lower surfaces to be bonded to the semiconductor substrate. The cross section of Comparison Example 2 has a flat lower surface and a middle-rounded upper surface to be bonded to the semiconductor substrate.

The solar cell lead wires of Examples 1, 2, 3, 4 and 5 and Comparison Examples 1 and 2 are coated with a suitable amount of rosin-based flux, placed on a copper sheet, and hot-plate heated (held at 260° C. for 30 sec), for soldering the solar cell lead wires to the copper sheet. Further, a 90° debonding test is done to evaluate the bonding strength of these copper sheet-soldered solar cell lead wires to the copper sheet. Also, these solar cell lead wires are placed on electrode portions on both sides of a 150 mm long×150 mm wide×180 μm thick semiconductor substrate (Si cell), and with a 100 g weight placed thereon, likewise hot-plate heated (held at 260° C. for 30 sec), for soldering. Cell cracking during the soldering is examined. In Comparison Example 2, cell cracking is examined for each of the cases of upper surface bonding and lower surface bonding.

The evaluation results of Examples 1, 2, 3, 4 and 5 and Comparison Examples 1 and 2 are shown in Table 2.

the figure in which the cross-section shape is shown. The "Bonding strength" row exhibits the result of the 90° debonding test which tests the tensile force at debonding when tensioning the cupper sheet and solar cell lead wire, where "A" means the tensile force of not less than 20 N, "B" means the tensile force of 10-20 N, and "C" means the tensile force of not more than 10 N.

The "Cell cracking" row exhibits the presence/absence of cell cracking in solder-bonding the rectangular wire to both sides of the cell, where the cell cracking is determined to be present if there is one or more visible cell cracks, and not present otherwise, and where "a" means that the ratio of no cell cracking in the entire bonded area is not less than 90%, "b" means that it is not less than 70% and less than 90%, and "c" means that it is less than 70%.

(The ratio of no cell cracking)=[(the number of cells not cracking)/(the number of cells soldered)]×100

As shown in Table 2, it has been verified that the solar cell lead wires of Examples 1-5 provide the excellent bonding strength since the melt solder-plated layer is supplied with melt solder on its upper and lower sides, rolled and thereby formed to be flat.

In particular, the solar cell lead wire 10 of Example 1 provides the high bonding strength since the melt solder-plated layer is sufficiently supplied with melt solder on its upper and lower sides from middle to ends and formed to be flat, so that the melt solder, which contributes to bonding, is sufficiently supplied to form a good fillet.

Since the solar cell lead wire 10 of Example 1 is flat at the bonded surface with the semiconductor substrate, surface contact as in the solar cell (FIG. 5) of the present invention, not point contact as in the conventional solar cell (FIG. 6), is possible. Further, in the solar cell lead wire 10 of Example 1, since the melt solder is sufficiently supplied from middle to ends to allow much solder contribute to bonding, a good solder fillet is formed. This results in an enhancement in bonding properties (strength and conductivity).

TABLE 2

|  |  | Ex 1 | Ex 2 | Ex 3 | Ex 4 | Ex 5 | Comp Ex 1 | Comp Ex 2 |
|---|---|---|---|---|---|---|---|---|
| Conductor processing | | roll | roll | roll | roll | slit | roll | slit |
| End plating thickness | | | | | | 5 μm | | 4 μm |
| Cross section shape | | FIG. 1A | FIG. 2A | FIG. 2B | FIG. 2C | FIG. 3 | FIG. 7 | FIG. 8 |
| Bonding strength | Lower surface | A | A | B | A | B | C | B |
|  | Upper surface | A | B | B | A | B | C | C |
| Cell cracking | Lower surface | a | a | a | a | a | b | c |
|  | Upper surface | a | a | a | a | a | b | a |

Notes:
Ex: Example,
Comp Ex: Comparison Example

In Table 2, the "Conductor processing" row exhibits the processing method for forming a rectangular wire strip-shaped conductive material from a conductive raw material. The "End plating thickness" row exhibits the plating thickness coated on burr at an end of the lower surface in the case of conductor slitting. The "Cross-section shape" row exhibits Also, as shown in Table 2, it has been verified that the solar cell lead wires 10, 20, and 30 of Examples 1-5 inhibit cell cracking since the melt solder-plated layer is formed to be flat on its upper and lower sides by roll plating.

In contrast, Comparison Example 1, which performs rolling but no roll plating, exhibits cell cracking, and slightly poor bonding strength compared to the present invention. Comparison Example 2, which performs slitting but no roll plating, exhibits excellent bonding strength, but cell cracking when the bonded surface is a flat side surface. When its bonded surface is a rounded side surface, it exhibits no cell cracking, but slightly poor bonding strength compared to the present invention.

As above, from the evaluation results of Examples 1, 2, 3, 4 and 5, and Comparison Examples 1 and 2, it has been verified that the present invention has a high cell cracking inhibiting effect.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A solar cell lead wire, comprising:
a strip-shaped conductive material formed by rolling a wire with a circular cross section; and
upper and lower melt solder-plated layers comprising flat upper and lower surfaces, respectively, of the strip-shaped conductive material by supplying melt solder thereto.

2. The solar cell lead wire according to claim 1, wherein the strip-shaped conductive material comprises a rectangular wire whose volume resistivity is not more than 50 $\mu\Omega\cdot$mm.

3. The solar cell lead wire according to claim 1, wherein the strip-shaped conductive material comprises one of Cu, Al, Ag and Au.

4. The solar cell lead wire according to claim 1, wherein the strip-shaped conductive material comprises one of a tough pitch Cu, a low oxygen Cu, an oxygen-free Cu, a phosphorous deoxidized Cu, and a high purity Cu whose purity is not less than 99.9999%.

5. The solar cell lead wire according to claim 1, wherein the melt solder-plated layers comprise a Sn-based solder or a Sn-based solder alloy containing Sn as a first component, and not less than 0.1 mass % of at least one element selected from Pb, In, Bi, Sb, Ag, Zn, Ni, and Cu, as a second component.

6. A solar cell, comprising:
the solar cell lead wire according to claim 1; and
a semiconductor substrate comprising frontside and backside electrodes,
wherein the solar cell lead wire is soldered to the frontside and backside electrodes of the semiconductor substrate with the solder of the melt solder-plated layers.

7. The solar cell lead wire according to claim 1, wherein the strip-shaped conductive material comprises the wire with the circular cross section.

8. The solar cell lead wire according to claim 1, wherein said flat upper and lower surfaces of the upper and lower melt solder-plated layers respectively extend from an edge of the upper and lower melt solder-plated layers to another edge of the upper and lower melt solder-plated layers.

9. The solar cell lead wire according to claim 1, wherein a thickness of the lower melt solder-plated layer is at least 5 $\mu$m at both ends.

10. The solar cell lead wire according to claim 1, wherein a thickness at both ends of the lower melt solder-plated layer is specified in a predetermined range, and
wherein the lower surface thereof is depressed.

11. A production method for a solar cell lead wire, said method comprising:
rolling a wire with a circular cross section to thereby form a strip-shaped conductive material;
heating the strip-shaped conductive material in a continuous current heating furnace, a continuous heating furnace, or a batch-type heating equipment;
subsequently supplying melt solder to solder-plate the strip-shaped conductive material; and
sandwiching the plated strip-shaped conductive material between rolls to thereby form flat melt solder-plated layers.

12. The method according to claim 11, wherein a thickness of one of the melt solder-plated layers, which is disposed on a lower surface of the strip-shaped conductive material, is at least 5 $\mu$m.

* * * * *